United States Patent [19]

Klank et al.

[11] Patent Number: 5,025,406
[45] Date of Patent: Jun. 18, 1991

[54] ADAPTIVE DIGITAL FILTER FOR MULTI PATH DISTORTION CANCELLATION

[75] Inventors: Otto Klank, Lehrte-Arpke; Dieter Rottmann, Hanover, both of Fed. Rep. of Germany

[73] Assignee: Deutsche Thomson-Braudt GmbH, Ullingen-Schweinningen, Fed. Rep. of Germany

[21] Appl. No.: 447,279

[22] Filed: Dec. 7, 1989

[30] Foreign Application Priority Data

Dec. 8, 1988 [DE] Fed. Rep. of Germany ....... 3841268

[51] Int. Cl.$^5$ ............................................. G06F 15/31
[52] U.S. Cl. ............................................. 364/724.19
[58] Field of Search .................... 364/724.01, 724.19, 364/750.5, 724.2

[56] References Cited

U.S. PATENT DOCUMENTS

| | | | |
|---|---|---|---|
| 4,254,474 | 3/1981 | Cooper et al. | 364/724.19 |
| 4,550,415 | 10/1985 | Debus, Jr. | 375/14 |
| 4,701,873 | 10/1987 | Schenk | 364/724 |
| 4,727,424 | 2/1988 | Chao | 358/167 |
| 4,843,583 | 6/1989 | White et al. | 364/724.19 |

FOREIGN PATENT DOCUMENTS

| | | |
|---|---|---|
| 0147326 | 7/1983 | European Pat. Off. . |
| 0033216 | 10/1985 | European Pat. Off. . |
| 0255554 | 8/1986 | European Pat. Off. . |
| 0268408 | 5/1988 | European Pat. Off. . |
| 2420831 | 11/1974 | Fed. Rep. of Germany . |
| 270307 | 7/1978 | Fed. Rep. of Germany . |
| 2703166 | 7/1978 | Fed. Rep. of Germany . |
| 3427349 | 1/1986 | Fed. Rep. of Germany . |
| 2201854 | 9/1988 | United Kingdom . |

OTHER PUBLICATIONS

Donald Hirsch, "A Simple Adaptive Equalizer for Efficient Data Transmission", IEEE Trans. On Communication Technology, vol. COM-18, No. 1, 2/70, pp. 5-11.

Primary Examiner—Gary V. Harkcom
Assistant Examiner—Long T. Nguyen
Attorney, Agent, or Firm—Joseph S. Tripoli; Eric P. Herrmann; James B. Hayes

[57] ABSTRACT

Apparatus in a receiver for adaptively adjusting the receiver response to changing signal conditions includes a shift register for serially loading signal and having parallel output taps for providing a plurality of signal samples in parallel. Matrix circuitry, coupled to the output taps, is arranged to provide the signal samples in a predetermined order to facilitate forming sums of products of such signal samples.

10 Claims, 2 Drawing Sheets

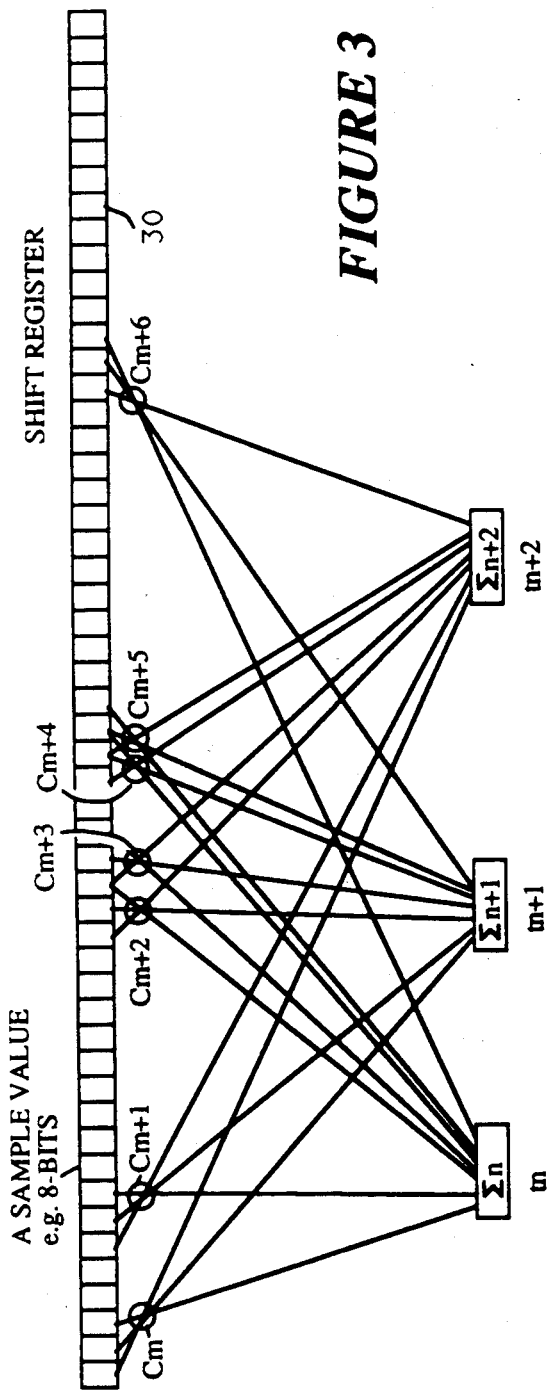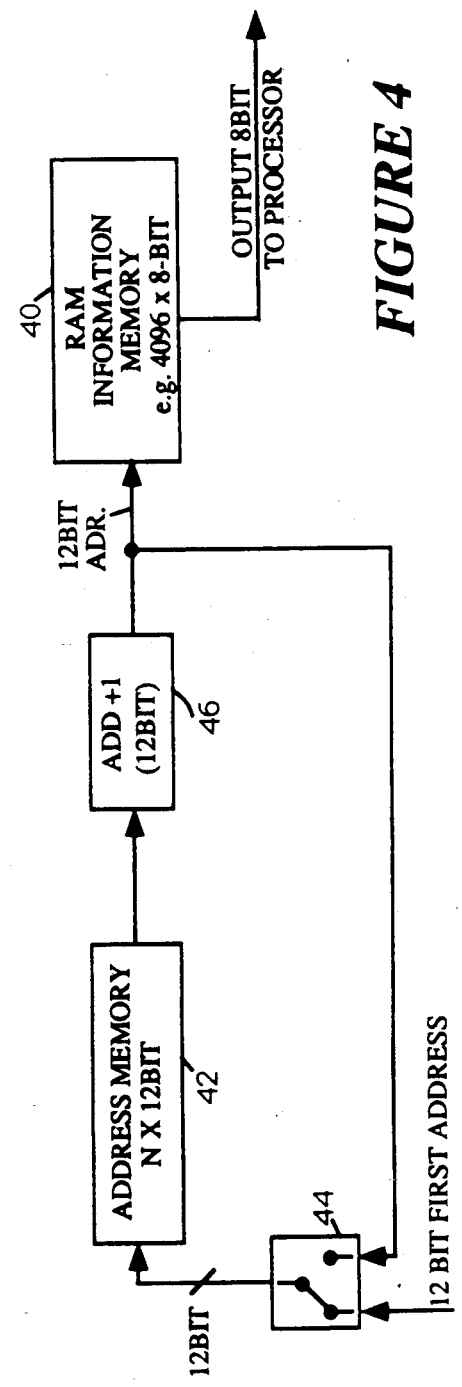

ADAPTIVE DIGITAL FILTER FOR MULTI PATH DISTORTION CANCELLATION

The invention relates to adaptive filter apparatus.

BACKGROUND OF THE INVENTION

In the wireless transmission of information signals, extinction of signal constituents may arise due to multiple-path reception. It is known to reduce such disturbances by reconstructing the signal with appropriate signal processing in the receiver and/or by selection of transmission frequencies less susceptible to multi-path contamination.

Concerning stationary receivers, it is only necessary to perform an adjustment of the receiver to the respective reception condition once, for example, after energizing the receiver. However, in receivers which are used in motor vehicles, a continuous adjustment to the fast-changing receiving conditions is necessary. This can be achieved by, for example, periodically transmitting a test sequence and evaluating it via correlation processes in the receiver. The correlation results determine the adjustment (corrective) values for an (adaptive) filter which is to be switched into the signal path. Such methods are described in the following papers, for example: G. D. Forney, Jr. "Training adaptive linear filters", U.S. Pat. No. 3,723,911 Mar. 27, 1973; and K. H. Mueller and D. A. Spaulding, "Cyclic equalization - a new rapidly converging equalization technique for synchronous data communication", Bell System. J., pp 369–406, February 1975. The adaptive methods which are described in these papers require a very significant technical effort, which may be accomplished, for example, with a calculator (signal processor) having appropriate capacity.

Typically this task is performed with a filter arrangement, including a shift register and a calculator, which can be continuously adjusted to changing reception conditions. The information "to be filtered" consists of, for example, a sequence of digital coded values each of 8 bits and is constantly fed to the shift register. The shift register is so proportioned that, for example, at least 1024 values each of 8 bits can be stored. Using this long length of, for example, 1024 values, a new output value is calculated according to predetermined mathematical laws for every single value by means of a calculator, for example, a signal processor. Each output value determined by the calculator depends on the 1024 different values. The mathematical law implemented is maintained constant for each output value generated for this length of information and possibly for considerably longer lengths of, for example, several thousand values. At the end of each sequence of input values of, for example, 1024 values, or at the end of even longer sequences of, for example, several blocks of 1024 bits each, the 'creation rule' which has been assigned to the filter for the calculation of the new output values may be altered.

The process requires a large amount of computing effort for each starting value, for example, 1024 8-bit multiplications plus summation of the respective products. Calculations for successive output values are effectively carried out serially including the single starting value. The corresponding basic values for successive calculations are made available through intermediate rotations of the shift register. In the selected example the time available for the calculation of the longer lengths (series) of data amounts to a few milliseconds, i.e. about 1000 output values have to be calculated in about one millisecond, meaning about 1000 multiplications (per output value) per micro-second. This cannot be achieved even with the best available processors. Nor can such a data sequence be read out from a shift register in the allotted time. As the process time for a multiplication amounts to, for example, 25 ns, a correspondingly large number of processors must be operated in parallel, in order to solve the task, which can be ruled out because of the costs and other practical reasons relating to technical devices for consumers.

It is the object of the invention to provide a practical filter arrangement for consumer receivers which can be adjusted to very rapid-changing reception conditions.

SUMMARY OF THE INVENTION

The present invention is apparatus in a receiver for adaptively adjusting the receiver response to changing signal conditions. The apparatus includes a shift register for serially loading signal and having parallel output taps for providing a plurality of signal samples in parallel. Matrix circuitry, coupled to the output taps, is arranged to provide the signal samples in a predetermined order to facilitate forming sums of products of such signal samples.

BRIEF DESCRIPTION OF THE DRAWINGS

FIG. 3 is a diagram showing an example of simultaneous calculation of a number of output values.

FIG. 4 is a block diagram of an alternative embodiment of apparatus for providing signal samples in a desired order.

DETAILED DESCRIPTION

Figure 1:
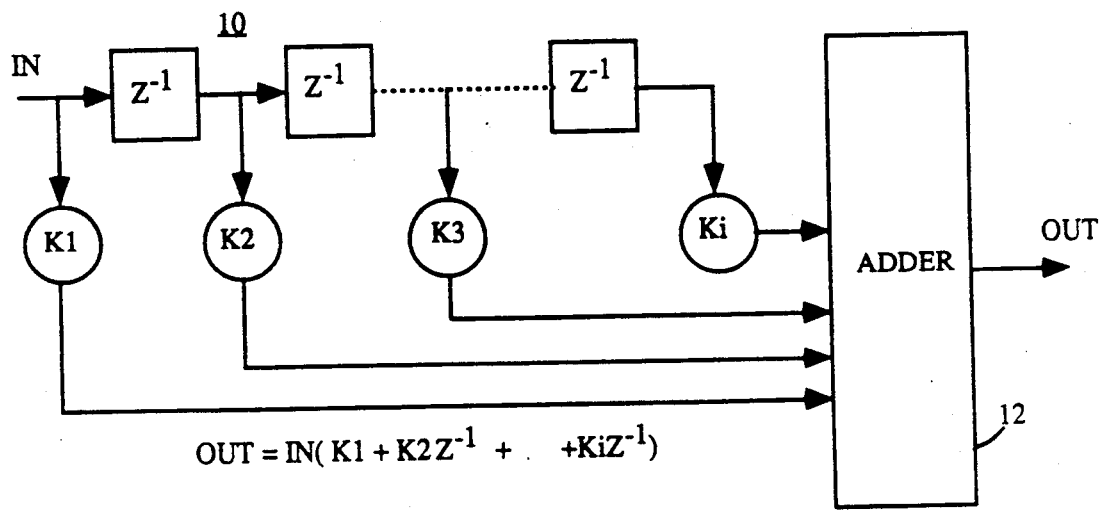
FIG. 1 is a schematic diagram of a digital transversal filter.

FIG. 1 shows a prior art transversal filter which has been used in tailoring a processing channel to changing signal conditions. The data of a digital coded information signal are fed to a shift register 10. Output signal is formed by multiplying output samples provided by the shift register with certain coefficients (K1 . . . Ki) and adding the products in an adder circuit 12.

Figure 2:
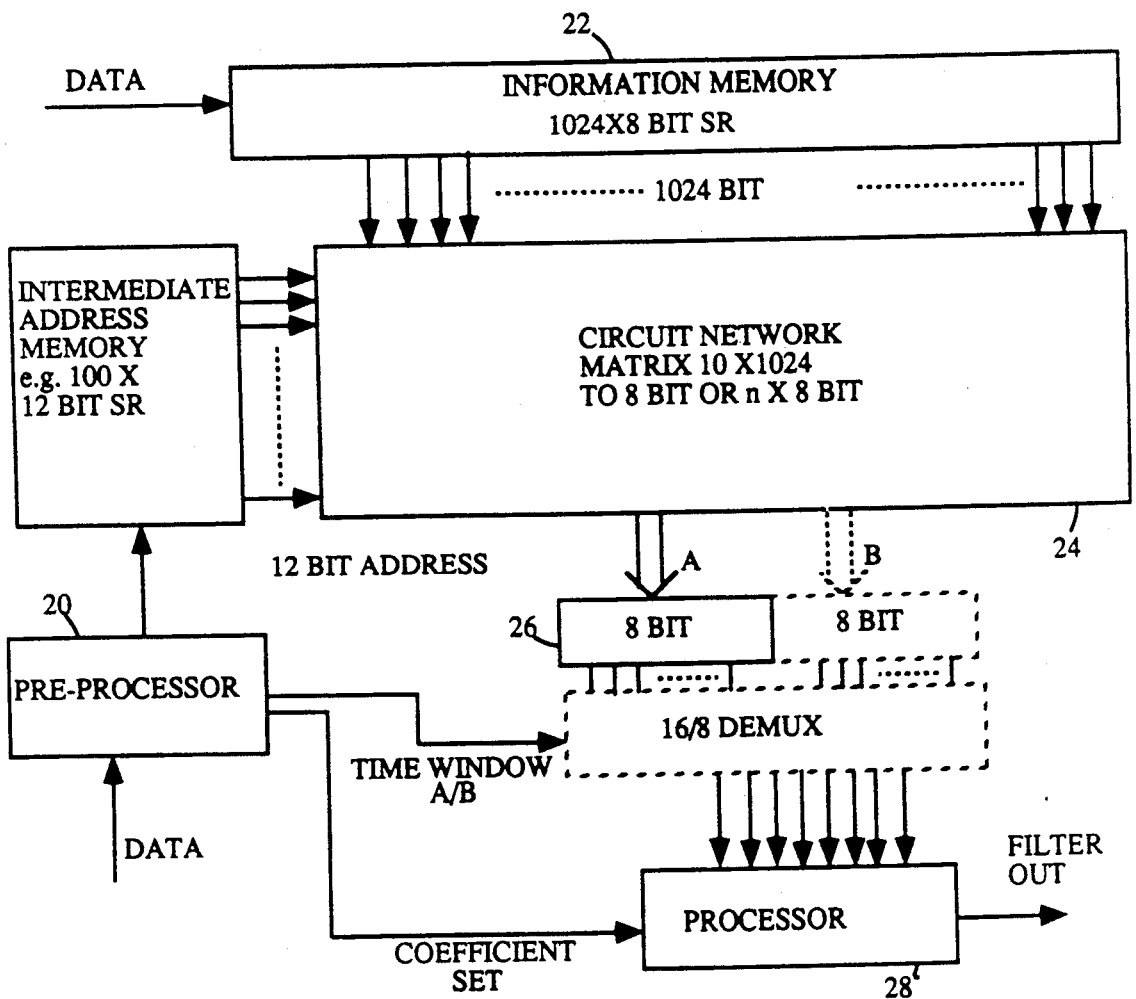
FIG. 2 is a block diagram of a portion of a receiver including apparatus embodying the invention.

FIG. 2 shows an exemplary implementation of the invention in which the aim is to achieve serial calculations of successive output values with only one processor. Theoretically each output value is the sum of products of each sample in a predetermined sequence times respective coefficient values. However certain of the coefficients are zero valued or near zero value. In FIG. 2 a "pre-processor" 20 which may include a correlator to generate the respective coefficients, determines the signal samples which would be multiplied by zero or near zero valued coefficients in order to eliminate all of the products produced with zero valued coefficients because they do not contribute to the product summation. In addition the coefficients are sorted according to their size and are limited to a predetermined number of, for example, 50 (out of 1024). The remaining coefficients all have values which exceed a predetermined threshold.

As in FIG. 1 the circuit of FIG. 2 contains a shift register memory 22 of corresponding length, for example, 1024 values of 8 bits. Because the values to be used in the calculation are now distributed at random over the register the particular values can no longer be made available simply by shifting the register. This would unnecessarily increase the requirements which are demanded of the shift register technology. The parallel outputs of the respective shift register cells are therefore connected to a circuit matrix 24 so that corresponding groups of shift register outputs can be directed to a corresponding number of output connections of the matrix. The circuit matrix is operated with an address sequence which has been determined by the preprocessor to provide signal values which do not contribute zero products. The order in which the values are provided is not important in a calculation because all of the products are combined in one sum.

The 8 bit values are assigned serially to respective outputs of the shift register, or to respective inputs of the matrix 24, so that the transmission of a value occurs serially. As in FIG. 1 it can be advantageous of the adjustment of the computing process in the processor, if part of the values are intermediately stored in an output of the matrix 26 (register A, B etc.). Therefore, the matrix is to be adequately enlarged if necessary.

Sample values from the matrix 24 are coupled to a processor 28. The non zero coefficients from the preprocessor 20 are also coupled to the processor 28. Processor 28 multiplies respective sample values by the appropriate coefficients and forms sums of such products to genertate a filtered output signal.

FIG. 3 demonstrates the calculation process of the system for several output values. The row of boxes 30 represents respective sample values contained in the shift register. The circles designated by $C_{m+i}$ represent coefficient multipliers for multiplying a value in the register connected to the circle by a line. The boxes designated with a $\Sigma n+i$ represent summing and storage elements for accumulating products developed by coefficient multipliers connected thereto by respective lines. The processor works alternately in several summation memories (accumulators). The assignment of the values in the computing process is shown. The advantages are, that at any one time the neighboring cells of the shift register can be combined in blocks and read out serially through partial rotations; furthermore the multipliers in the processor can be kept constant for the combined value group. For a new value group the shift register is shifted a block length.

FIG. 4 shows another exemplary implementation in which the function of the shift register memory of FIG. 1 is performed by a RAM module (Random Access Memory) 40 with correspondingly low access time. In this case it must be guaranteed that the required memory contents reach the output through an address estimation and operation. The theoretically required number of addresses corresponds to the number of constants (coefficients; in the chosen exmaple, 50) multiplied by the number of the output values which have to be calculated in sequence for a section with constant coefficients. This would amount to, for example, in the case of 2000 output values, 100,000 addresses to be calculated. In an advantageous way a single (first) address set, 50 in the chosen example, can be assumed if the values in the RAM module are correspondingly arranged (similar to the shift register), and in a simple computing process all the addresses can be increased by 1 for each new output value or decreased by 1 in the case of a reversed order in the memory.

The first address is coupled to an address memory 42 via a two-to-one multiplexer 44. The first address stored in memory 42 is applied to an incrementing circuit 46 which adds a constant value, e.g., one, to the first address value. The incremented address value is applied to the address input of the RAM 40, and also to the input of the address memory 42, via the multiplexer 44. In this manner the address values are successively incremented.

In principle, for a given set of coefficient values, a complete block of sample values must be retained in the RAM for the period required to generate output samples corresponding to each input sample in a respective block. If data in the RAM were lost during such period the RAM would have to be reloaded in a particular order which would probably mean an exchange of the total memory contents and the computing process would be defeated. Of course, any information which is no longer required may be obliterated and continuously replaced with newly-arrived information. However, because the order in which data is read from memory is different from the order in which data is written into the memory, if new data is to be continually input to memory, a complicated calculation of the memory addresses would have to be performed.

In particular receivers it may be necessary to process several signals, for example, the I- and Q-signals provided in 4PSK demodulation, to perform filtering. This filtering may require several different filtering processes, for example, the so-called matched-filter-process and an equalization process. As long as the computing capacity of the processors allows it, the individual processes are combined (I and Q) or sometimes performed in sequence by the same processor (matched filter and equalizer). In the case of the I- and Q-signals two shift registers working in parallel should be used. Calculated intermediate values are to be stored in an intermediate memory, for example, the output values of the matched filters, so one can carry out the equalizer process with them.

What is claimed is:

1. An adaptive filter comprising:
   a source of signal to be filtered;
   shift register means for serially loading said signal and providing parallel output samples at parallel output terminals;
   matrix means coupled to said parallel output terminals, and responsive to control signals, for providing groups of predetermined ones of said output samples to respective matrix output terminals;
   processing means, coupled to said matrix means, for generating as an output signal, sums of products of said ones of said output samples and predetermined coefficients;
   preprocessor means, responsive to said source of signal, for generating filter coefficients for each samples provided by said shift register means and providing as said predetermined coefficients only coefficients having values which exceed a predetermined value, and providing control signals corresponding to samples for which coefficients exceed said predetermined value.

2. The adaptive filter set forth in claim 1 wherein said matrix means includes means for intermediately storing ones of said predetermined ones of said output samples.

3. The adaptive filter set forth in claim 1 wherein said processing means includes means for serially forming ones of said products and for successively accumulating said products to provide said output signal.

4. An adaptive filter of the type which forms an output sample from a block of sample values by forming a sum of products of sample values and predetermined coefficients, said adaptive filter comprising:

a source of signal sample values;

preprocessor means, responsive to said source of signal sample values, for determining coefficients and control signals indicating ones of said signal sample values which when multiplied by its respective coefficient will produce a nonzero product;

means, coupled to said source, and responsive to said control signals, for providing at respective output terminals, said ones of said sample values from a block of sample values;

processing means, coupled to said means for providing said ones of said sample values, and responsive to said coefficients for generating sums of products of said ones of said sample values and said coefficients.

5. The adaptive filter set forth in claim 4 wherein said means for providing said ones of said signal sample values includes;

shift register means for serially loading said signal sample values and providing parallel output samples at parallel output terminals;

matrix means coupled to said parallel output terminals, and responsive to control signals, for providing groups of predetermined ones of said output samples to respective matrix output terminals.

6. The adaptive filter set forth in claim 4 wherein said means for providing said ones of said signal sample values includes;

a random access memory coupled to said source; and means responsive to said control signals for generating and applying address signals to said random access memory.

7. The adaptive filter set forth in claim 6 wherein said means for generating address signals generates write address values for writing successive signal sample values into said random access memory, and read address values for reading from said random access memory, only signal sample values corresponding to said ones of said signal sample values which when multiplied by its respective coefficient will produce a nonzero product.

8. The adaptive filter set forth in claim 4 wherein said processing means includes means for serially forming ones of said products and for successively accumulating said products to provide said output sample.

9. An adaptive filter of the type which forms an output sample from a block of signal sample values by forming a sum of products of signal sample values and predetermined coefficients, said adaptive filter comprising:

a source of signal sample values;

means coupled to said source of signal sample values for storing a block of N successive signal sample values, N is an integer;

means, coupled to said means for storing, and responsive to control signals, for providing at at least one output terminal thereof, M signal sample values from said block, M is an integer less than N;

processing means, coupled to said means for providing said M signal sample values, and responsive to coefficients, for generating sums of products of said M signal sample values and said coefficients; and preprocessor means, responsive to said source of signal sample values, for determining filter coefficients for each of said N signal sample values and selecting the M largest of said filter coefficients as said coefficients utilized by said processing means, and for generating said control signals, said control signals for selecting said M signal sample values corresponding to said M largest of said filter coefficients.

10. The adaptive filter set forth in claim 9 wherein said processing means includes means for serially forming ones of said products and for successively accumulating said products to provide said output sample.

* * * * *